US007998528B2

(12) United States Patent
Hubert et al.

(10) Patent No.: US 7,998,528 B2
(45) Date of Patent: Aug. 16, 2011

(54) METHOD FOR DIRECT FABRICATION OF NANOSTRUCTURES

(75) Inventors: Brian Hubert, Menlo Park, CA (US);
Joseph Jacobson, Newton, MA (US);
Aggelos Bletsas, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1474 days.

(21) Appl. No.: 10/367,616

(22) Filed: Feb. 14, 2003

(65) Prior Publication Data

US 2004/0026007 A1    Feb. 12, 2004

Related U.S. Application Data

(60) Provisional application No. 60/357,006, filed on Feb. 14, 2002.

(51) Int. Cl.
  *B05D 5/00*  (2006.01)
  *B05D 7/00*  (2006.01)
  *B05D 1/34*  (2006.01)
  *B05D 1/36*  (2006.01)

(52) U.S. Cl. ........ 427/256; 427/258; 977/849; 977/850; 977/851; 977/855; 977/860

(58) Field of Classification Search .......... 427/256, 427/258; 977/849–851, 855, 857, 858, 860
See application file for complete search history.

(56) References Cited

U.S. PATENT DOCUMENTS

| 4,987,312 | A | * | 1/1991 | Eigler | 250/492.3 |
|---|---|---|---|---|---|
| 5,846,909 | A | | 12/1998 | McDevitt et al. | 505/233 |
| 5,880,012 | A | | 3/1999 | Ha et al. | 438/494 |
| 5,922,214 | A | | 7/1999 | Liu et al. | 216/2 |
| 6,218,086 | B1 | | 4/2001 | Binnig et al. | 430/330 |
| 6,270,946 | B1 | | 8/2001 | Miller | 430/296 |
| 6,635,311 | B1 | | 10/2003 | Mirkin et al. | |
| 6,827,979 | B2 | * | 12/2004 | Mirkin et al. | 427/256 |
| 7,273,636 | B2 | * | 9/2007 | Mirkin et al. | 427/256 |
| 2002/0063212 | A1 | | 5/2002 | Mirkin et al. | 250/306 |
| 2002/0084410 | A1 | * | 7/2002 | Colbert et al. | 250/306 |
| 2002/0122873 | A1 | | 9/2002 | Mirkin et al. | 427/598 |

OTHER PUBLICATIONS

Hong et al., "Multiple Ink Nanolithography: Toward a Multiple-Pen Nano-Plotter," Science, vol. 286, Oct. 15, 1999, pp. 523-525.*
Hong et al., "A Nanoplotter with Both Parallel and Serial Writing Capabilities," Science, vol. 288, Jun. 9, 2000, pp. 1808-1811.*
Bulthaup et al., "Direct Fabrication of All-Inorganic Logic Elements and Microelectromechanical Systems from Nanoparticle Precursors," Mat. Res. Soc. Symp. Proc., vol. 636, copyright 2001, pp. D10.4.1-D10.4.7.*
M. Ben Ali, T. Ondarcuhu, M. Brust, and C. Joachim "Atomic Force Microscope Tip Nanoprinting of Gold Nanoclusters", American Chemical Society, pp. 872-876 (2002).

(Continued)

*Primary Examiner* — William Phillip Fletcher, III
(74) *Attorney, Agent, or Firm* — Norma E. Henderson

(57) ABSTRACT

An all-additive method for direct fabrication of nanometer-scale planar and multilayer structures comprises the steps of acquiring a transferable material with a submillimeter-scale tip, depositing at least a portion of the acquired first transferable material at a predetermined location onto a substrate without a bridging medium, and repeating to create a structure using the transferable material.

41 Claims, 9 Drawing Sheets

OTHER PUBLICATIONS

"The Atomic Force Microscope (AFM)", www.sst.ph.ic.ac.uk/photonics/intro/AFM.html, accessed on Apr. 18, 2002.

"Atomic Force Microscope", www.che.utoledo.edu/nadarajah/webpages/whatsafm.html., accessed on Apr. 18, 2002.

"How AFM works", stm2.nrl.navy.mil/how-afm/how-afm.html, accessed on Apr. 18, 2002.

S. Hsieh, S. Meltzer, C. Wang, A. Requicha, M. Thompson, and B. Koel, "Imaging and Manipulation of Gold Nanorods with an Atomic Force Microscope", The Journal of Physical Chemistry B, vol. 106, No. 2, Jan. 17, 2002.

C. Bulthaup, E. Wilhelm, B. Hubert, B. Ridley, and J. Jacobson, Direct Fabrication of All-Inorganic Logic Elements and Microelectromechanical Systems From Nanoparticle Precursors, Materials Research Society, vol. 636 (2001).

Saul Griffith, "Towards personal fabricators: Tabletop tools for micron and sub-micron scale functional rapid prototyping", 2000, Thesis, Master of Science, Program in Media Arts and Sciences, Massachusetts Institute of Technology, (2000).

B. Ridley, B. Nivi, B. Hubert, C. Bulthaup, E. Wilhelm, and J. Jacobson, "Solution-Processed Inorganic Transistors and Sub-Micron Non-Lithographic Patterning Using Nanoparticle Inks", Materials Research Society vol. 581, pp. 115-120 (2000).

HC Manoharan, CP Lutz and DM Eigler, "Quantum mirages formed by coherent projection of electronic structure", Nature, vol. 403, No. 6769, 512-515 (2000).

S Hong and CA Mirkin, "A nanoplotter with both parallel and serial writing capabilities", Science, vol. 288, Jun. 9, 1808-1811 (2000).

ADL Humphris, J Tamayo and M.J Miles, "Active quality factor control in liquids for force spectroscopy", Langmuir, vol. 16, No. 21, pp. 7891-7894 (2000).

S Hong, J Zhu, and CA Mirkin, "Multiple ink nanolithography: Toward a multiple-pen nano-plotter", Science, vol. 286, Oct. 15, 523-525 (1999).

A Kawaji, F Arai, T Sugiyama and T Fukuda, "Three-dimensional Bio-micromanipulation," Advanced Robotics, vol. 13, No. 3, VSP and RSJ, pp. 321-322 (1999).

S Saito, H Miyazaki, and T Sato, "Pick and place operation of a micro-object with high reliability and precision based on microphysics under SEM", Int'l Conf. on Robotics and Automation, May 10-15, 1999, IEEE Proceedings, vol. 4, pp. 2736-2743 (1999).

R Resch, N Montoya, BE Koel, A Madhukar, AAG Requicha and P Will, "Manipulation of gold nanoparticles in liquids using MAC mode Atomic Force Microscopy", Molecular Imaging Application Note, Apr. 1999.

MR Falvo, RM Taylor II, A Helser, V Chi, FP Brooks Jr, S Washburn and R Superfine, "Nanometre-scale and rolling and sliding of carbon nanotubes", Nature, vol. 397, No. 6716, 236-238 (1999).

T Kasaya, H Miyazaki, S Saito and T Sato, T, "Micro object handling under SEM by vision-based automatic control", Int'l Conf. on Robotics and Automation, May 10-15, 1999, IEEE Proceedings, vol. 3, pp. 2189-2196 (1999).

KS Wilder, CF Quate, D Adderton, R Bernstein and V Elings, "Noncontact nanolithography using the atomic force microscope", Appl. Phys. Lett., vol. 73, No. 17, pp. 2527-2529 (1998).

Takeshi Kasaya, Hideki Miyazaki, Shigeki Saito and Tomomasa Sato, "Micro-object handling under SEM by vision-based automatic control", pp. 181-192, SPIE Proceedings vol. 3519, Microrobotics and Micromanipulation (1998).

Yao-Joe Yang (Joseph Y.-J. Young), "Squeeze-film damping for MEMS structures", Thesis, Master of Science, Dept. of Electrical Eng., Massachusetts Inst. of Tech., Advisor: SD Senturia (Jan. 1998).

T Tanikawa, Y Hashimoto, and T Arai, "Micro drops for adhesive bonding of micro assemblies and making a 3-D structure 'micro scarecrow'", IEEE/RSJ Proc., Int'l Conf. on Intelligent Robots and Systems, Oct. 13-17, 1998, vol. 2, pp. 776-781 (1998).

Benjamin W. Chui, Jonathon Marmin, Bruce D. Terris, Dan Rugar, Kenneth e. Goodson, and Thomas W. Kenny, "Micromachined heaters with I-microsecond thermal time constants for AFM thermomechanical data storage", Proc. of Transducers, Jun. 1997, Chicago (1997).

Kazuhisa Ishii, Masayuki Nakao & Yotaro Hatamura, "A 1/100 Machine Tool to Fabricate 1/100 Micro Parts", Proc. of ASPE 12th Annual Meeting, vol. 16, Norfolk, Virginia, Oct. 5-10, 1997, pp. 482-485 (1997).

Osamu Nakabeppu, et al., "Experimental Study on Point Contact Transport Phenomena using the Atomic Force Microscope", Microscale Thermophysical Engineering, 1(3), pp. 201-213 (English) (1997).

Hideki Miyazaki and Tomomasa Sato, "Mechanical Assembly of Three-Dimensional Microstructures from Fine Particles", Advanced Robotics, 11, pp. 169-185 (English) (1997).

H Miyazaki, and T Sato, "Pick and place shape forming of three-dimensional micro structures from fine particles", IEEE, Proc. of the Int'l Conf. on Robotics and Automation, Apr. 22-28, vol. 3, pp. 2535-2540 (1996).

M Hatakeyama, Shuji Tanaka, K Ichiki, Y Toma, M Nakao and Yotaro Hatamura, "Novel Fast Atom Beam (FAB) Processes for Fabricating Functional Nanostructures on Three-dimensional Microstructures", Proc. Microsystem Technologies '96, Potsdam, pp. 499-504 (English) (1996).

Masayuki Nakao, Yotaro Hatamura and Tomomasa Sato, "Tabletop Factory to Fabricate 3D Microstructures, Nano Manufacturing World", Proc. ASPE 1996 Annual Meeting, Monterey, California, pp. 58-65, (English) (1996).

S. Tanaka, Masayuki Nakao and Yotaro Hatamura, et al., "New Fast Atom Beam Processing with Separated Masks for Fabricating Multiple Microstructures", Thin Solid Films, 281/282, pp. 630-633 (English) (1996).

Masayuki Nakao, Yotaro Hatamura, et al., "New-type Focused Fast Atom Beam (F-FAB) Source and Evaluation of Emitted Beam Density Distribution", Applied Surface Science, 100/101, pp. 277-282 (English) (1996).

H. Miyazaki and T. Sato, "Fabrication of 3d Quantum Optical Devices by Pick-and-Place Forming", Research Center for Advanced Science and Technology, pp. 318-324 (1996).

Y. Hatamura, M. Nakao, T. Sato, "Construction of Nano Manufacturing World", Microsystems Technologies 1 (3), pp. 155-162, (English) (1995).

Masayuki Nakao, Yotaro Hatamura and Tomomasa Sato, Koichi Koyano, et al., "Integration of 3-D shape Construciton and Assembly to Realize Micro Systems", Microsystem Technologies 1 (3), pp. 277-283 (English) (1995).

Jacob Israelachvili, "Intermolecular and surface forces", second edition 1998, Academic Press, London, pp. 326-334 (1992).

BV Derjaguin, VM Muller and YP Toporov, Journal of Colloid Interface Science, vol. 53, pp. 314-320 (1975).

KL Johnson, K Kendall and AD Roberts, "Surface energy and the contact of elastic solids", Proceedings of the Royal Society A, vol. 324, pp. 301-313 (1971).

WS Griffin, HH Richardson and S Yamanami, "A study of fluid squeeze-film damping," J. Basic Eng., Trans. ASME, pp. 451-456, Jun. 1966.pp. 451-456 (1966).

* cited by examiner

METHOD FOR DIRECT FABRICATION OF NANOSTRUCTURES

RELATED APPLICATION

This application claims priority to and the benefits of U.S. Ser. No. 60/357,006, filed on Feb. 14, 2002, the entire disclosure of which is hereby incorporated by reference.

FIELD OF THE INVENTION

The present invention generally relates to the field of microfabrication, in particular, to direct fabrication and imaging of nanometer-scale structures using a scanning probe microscope, e.g. an atomic force microscope.

BACKGROUND OF THE INVENTION

Nanotechnologies promise to bring about the advent of very small, yet important electronic and biological devices with features that are only a few tens of nanometers across. A variety of nanometer-scale ("nano") materials, such as carbon nanotubes, nanoparticles, and molecular memories are being developed. However, improvements in the handling and patterning of these nanomaterials are necessary before they can be cost-effectively incorporated into useful nanodevices such as, for example, single-electron transistors, high-density gene chips, and terabyte-scale memory systems. These devices require new fabrication and patterning techniques that far exceed resolution limitations of known processing techniques.

For example, known lithographic methods that are at the heart of modern microfabrication, nanotechnology, and molecular electronics often rely on patterning a resistive film, followed by chemical etching of the substrate. A variety of such subtractive printing techniques employ scanning probe instruments, electron beams, or molecular beams to pattern substrates using self-assembling monolayers and other organic materials to form sacrificial resistive layers. Known microfabrication techniques such as photolithography, microcontact printing, micromachining, and microwriting can produce patterns as small as 100 nm, but the production of sub-100 nm structures still poses a challenge.

Also, many nanomaterials containing discrete components, e.g. nanotubes, must ordinarily be manipulated and directly assembled onto a surface without the assistance of resists, masks, or etching steps. Furthermore, many organic materials that could be useful in nanoscale devices, such as DNA and proteins, are easily damaged and, thus, are difficult to pattern to form very small structures. Thus, new methods are needed to address the challenge of patterning and constructing useful nanoscale devices.

Since its inception, scanning probe microscopy has proven to be a useful tool for high-resolution imaging of nanoscale structures. The scanning probe typically includes a cantilever made of silicon having a length of about 200 μm. The cantilever has a sharp tip at its end with a radius of curvature generally below 10 nanometers. Depending on the imaging mode used, topological features as fine as individual atoms can be resolved.

More recently, it has been shown that the tip of a scanning probe microscope, such as an atomic force microscope ("AFM"), may be useful for the direct assembly of nanostructures. The tip can be very sharp, with only a few atoms located at its apex. A number of techniques that use an AFM tip to push very small objects, including atoms, nanoparticles, and nanotubes across a surface to form simple patterns, have been developed. However, the pushing operations are very complex, and construction of useful structures is indirect and often prohibitively tedious.

Another process, known as "dip pen nanolithography" ("DPN"), uses an AFM tip to deposit a restricted set of organic molecules onto carefully chosen substrates. Generally, DPN is a nanolithography technique by which molecules are directly transported to a substrate. DPN utilizes a solid substrate as the "paper" and an AFM tip (or a near-field scanning optical microscope tip) as the "pen." The tip is coated with a patterning compound (the "ink"), and the coated tip is used to apply the patterning compound to the substrate to produce a desired pattern. The DPN delivery mechanism involves the formation of an adsorbed water meniscus around the tip to transfer the ink molecules to the substrate, and the control of the movement of the patterning molecules to the surfaces on which they are deposited by a driving force to form self-assembling monolayers.

Problems that arise with DPN technology stem from the dependence of this technique on the liquid meniscus and chemical affinity of the patterning material to the substrate. For example, the lateral width of the line written by the "pen" using DPN is limited by the width of the meniscus formed. The meniscus is subject to variations in the relative humidity as well as chemical interactions between the solvent and the substrate. The size of the meniscus may also affect the rate of the transport of the patterning compound to the substrate. Solubility characteristics of the "ink" molecules in a given solvent can create difficulty in establishing a desired line width and a suitable loading concentration of the ink in the solvent. Furthermore, surface tension characteristics of different solvents can lead to drip or rapid flow from the pen resulting in problems with precise control of the ink application under some circumstances. Finally, special substrate-liquid interactions and self-assembling chemistries may be necessary to promote the adhesion of the molecules to the substrate, limiting the kinds of materials that can be patterned in this fashion.

Thus, there remains an unresolved need in the art to enable rapid and direct patterning of arbitrary materials onto arbitrary substrates with nanoscale resolutions.

SUMMARY OF THE INVENTION

It is an object of the present invention to achieve direct deposition and patterning of nanoplanar and multi-structures at the desired precise locations.

It is another object of the present invention to enable patterning a wide variety of materials having useful electrical, chemical, mechanical, and biological properties onto a wide variety of substrates.

It is yet another object of the present invention to provide an efficient and inexpensive method of fabricating nanostructures that does not require tedious pushing or pulling of particles or other nanometer-sized objects along the surface of a substrate; and does not require special self-assembling chemistries or liquid-substrate interactions, such as water vapor-initiated menisci, to facilitate the transfer of molecules from the tip to the substrate.

Accordingly, a high-precision nanoprobe-assisted deposition process, capable of directly assembling planar and multi-layer nanostructures by incrementally building them from materials in a liquid or soft-solid phase, is disclosed herein. Also disclosed herein is an apparatus implementing such process. Accordingly, a high-precision nanoprobe-assisted deposition process, capable of directly assembling planar and multi-layer nanostructures by incrementally building them from materials in a liquid or soft-solid phase, is disclosed herein. Also disclosed herein is an apparatus implementing such process.

A key aspect of the present invention involves direct assembly of planar and multi-layer structures with nano-geometries by a discrete "pick-and-place" technique using a sharp tip mounted on a bendable cantilever, for example, a tip of a scanning probe microscope such as an AFM. The nanoassembly method of the invention facilitates high-resolution direct fabrication of arbitrary materials, many of which are not amenable to deposition using current probe-based patterning, DPN, or conventional lithography methods. Applications of the nanoassembly system of the invention include, but are not limited to, fabrication of ultra-density gene chips, high-capacity magnetic disk drives, and single electron transistors.

Unlike probe-based nanomanipulation techniques known in the art that push atoms or nanoparticles around on a surface, the nanoassembly method of the invention enables true "pick-and-place" retrieval and deposition of materials with a wide range of electrical, chemical, and mechanical properties. The AFM-assisted nanoassembly method of the invention is an all-additive process that substantially eliminates any waste. Exceedingly small quantities of material, a few thousand atoms at a time, can be picked up by an AFM tip from a reservoir and are then assembled at a designated construction site on the substrate to fabricate nanostructures without subsequent application of caustic chemicals, etchants, and other effluents that are typically used in known microfabrication methods.

Further, unlike known DPN methods, the present invention provides for deposition of various materials, e.g. metal nanoparticles, polymers, inks, solvents, organics, semiconductor nanoparticles and dielectric nanoparticles onto a variety of substrates without formation of an adsorbed substrate-material or substrate-tip bridging medium, such as a liquid meniscus of water adsorbed from humid air at the interface between the tip and the substrate. In accordance with the present invention, materials can be assembled using reservoirs containing liquids, soft solids, or collections of discrete nano-scale objects, such as nanoparticles, that have no chemical affinity to the substrate.

Throughout the following description, the term "ink" is used to generally refer to the material being deposited by the nanoassembly system to form nanoassembled structures. It should be understood that the term "ink" is used to refer to materials that are in either a liquid phase or solid phase or some phase in between (such as a gel or slurry). The term "ink" is also used to refer to a collection of solid discrete objects such as spheres, balls, nanoparticles, nanocrystals, nanotubes, nanorods, cubes, and tetrahedrons. These solid discrete objects may or may not be entrained in a gas-phase or liquid-phase fluid. The ink materials and nanoparticles, once assembled by the methods of the invention onto a substrate, are stable and can be used as the foundation of multi-layer nanostructures.

The invention makes use of a very sharp tip to transfer material. The tip may (but need not be) attached to a flexible medium such as a cantilever or spring, and may (but need not) be part of an AFM. In embodiments in which the tip is mounted to a cantilever, the terms "tip" and "cantilever" are used interchangeably. It is the tip and the manner in which it is used, rather than the specific mechanism by which it is operated or mounted, that is important to the invention.

According to embodiments of the invention, the tip is mounted on a bendable cantilever, for example, a cantilever of a scanning probe microscope, such as an AFM, and operates as a manipulator of both liquid and solid materials at nanometer scales. The tip may be controlled as part of the AFM feedback loop including the following components: a nano-scale tip mounted on a bendable cantilever; a sensor that monitors the degree of bending of the cantilever and the frequency of its oscillation (and thereby monitors the forces exerted onto the tip); and an actuator and feedback circuitry that cause the tip to deliver a specified level of force, impact velocity and/or impulse to the substrate. The dimensions of deposited nanostructures can be controlled by adjusting, at least (a) the rate of vibration of the tip; (b) the sharpness of the tip; (c) the viscosity, phase, and material properties of the ink; and (d) pressure and force impulse applied by the ink-laden tip to the substrate. For example, with respect to adjusting the viscosity of the ink, the smallest depositions are achieved when using very non-viscous fluids or near-hard solids that are nearly fully solidified;

larger depositions are obtained from more viscous fluids or soft solids; and the largest depositions are achieved using very viscous liquid-phase materials.

The resolution of the resulting nanostructures may approach 1 million dots per linear inch (1 trillion dots per square inch). Deposited volumes can be precisely controlled to span 10 orders of magnitude, from $10^{-24}$ to $10^{-14}$ liters. The nanostructures assembled using the method of the invention may have line widths of less than approximately 100 nm, with the smallest discrete circular features being less than 32 nm across. The method of the invention facilitates creating structures with height-to-width aspect ratios of better than 1-to-2 and provides improved control over line width and deposition rate, while being relatively insensitive to fluctuations in ambient conditions, such as temperature, humidity, atmospheric conditions, vibration, and thermal drift. A dot of material can be discretely deposited onto the substrate at rates greater than 1 dot per second.

In general, in one aspect, the invention features a nanoassembly apparatus that includes a nanometer-scale bendable cantilever having a tip mounted thereon; a controller; and a transport mechanism. The transport mechanism, responsive to the controller, causes the tip to discretely acquire a transferable material; scan the tip over a substrate; and deposit at least a portion of the acquired transferable material at a predetermined location directly onto the substrate without a bridging medium, thereby assembling a nanostructure on the substrate.

In one embodiment, the nanoassembly apparatus also includes one or more reservoirs from which the tip acquires the transferable material. Optionally, the transferable material does not chemically bond to the substrate upon deposition thereon. The nanoassembly apparatus may also include means for facilitating a continuous flow of the transferable material to the tip from the reservoir. In yet another embodiment, the temperature of the reservoir is controlled by the apparatus.

In some embodiments, the tip of the nanoassembly apparatus is a nanotube, for example, a carbon nanotube. In other embodiments, the tip is made of silicon.

The controller of the nanoassembly apparatus may include means for monitoring and controlling the forces exerted on the tip. In one embodiment, the controller also includes an actuator and feedback circuitry for causing the tip to apply a predetermined amount of force to the substrate. In another embodiment, the controller also includes means for monitoring a force with which the tip deposits the transferable material in order to determine an amount of the transferable material deposited. In yet another embodiment, the controller includes means for monitoring a force with which the tip acquires the transferable material in order to determine an amount of the transferable material acquired. For example, the controller monitors a deflection of the cantilever indicative of flooding of the tip and counteracts the cantilever deflection in response thereto. In yet another embodiment, the apparatus includes means for detecting flooding of the tip and counteracts this condition by adjusting the position of the tip in response thereto.

In one embodiment, the nanoassembly apparatus includes a curing device for curing of the transferable material deposited on the substrate, for example, a laser source, an ultraviolet light source, an electron-beam source, a heat source, an infra-red light source, an electric current source, or an electric voltage source. In one aspect of the invention, the tip comprises the curing device.

In some embodiments, the tip of the nanoassembly apparatus includes a plurality of sub-tips disposed in a predetermined arrangement. The plurality of sub-tips may simultaneously deposit the transferable material in a predetermined pattern onto the substrate in a single step, as well as simultaneously or independently acquire and deposit different transferable materials.

In some embodiments, the bendable cantilever and the controller are part of a scanning probe microscope, for example, an atomic force microscope. In one embodiment, the scanning probe microscope of the nanoassembly apparatus images the nanostructure following the deposition thereof. In yet another embodiment, the tip images or detects the structure before, during or after deposition of the transferable material.

The tip may be configured for vibration. In one embodiment, the tip vibrates when depositing the acquired transferable material onto the substrate. In another embodiment, the tip vibrates when acquiring the transferable material.

In some embodiments, the controller monitors the shift in a vibration frequency and/or vibration amplitude of the tip. Optionally, the controller controls the descent of the tip towards the substrate, the amount of the transferable material acquired by the tip, and/or the amount of the transferable material deposited onto the substrate by the tip by monitoring the shift in a vibration frequency and/or vibration amplitude of the tip. For example, monitoring the vibration amplitude facilitates control of the tip's descent and/or the amount of transferable material acquired by (and/or deposited by) the tip.

In general, in another aspect, the invention features a method for nanoassembly that includes the steps of providing a tip mounted on a bendable cantilever, causing the tip to discretely acquire a first transferable material, scanning the tip over a substrate, and operating the tip to deposit at least a portion of the acquired first transferable material at a predetermined location directly onto the substrate without a bridging medium. The method further includes repeating the latter three steps to create a nanostructure using the first transferable material. A resulting nanostructure may be two-dimensional, or three-dimensional, with at least some of the transferable material being deposited onto previously deposited transferable material.

In one embodiment, the method of the invention also includes facilitating a continuous flow of the transferable material to the tip from the reservoir. In another embodiment, the transferable material does not chemically bond to the substrate upon deposition thereon.

The method for nanoassembly may also include monitoring and controlling the forces exerted on the tip. In one embodiment, the method includes causing the tip to apply a predetermined amount of force to the substrate. In another embodiment, the method includes monitoring a force with which the tip deposits the transferable material onto the substrate in order to determine an amount of the transferable material deposited. In yet another embodiment, the method includes monitoring a force with which the tip acquires the transferable material in order to determine an amount of the transferable material acquired. Also, the method may include monitoring a deflection of the cantilever indicative of flooding of the tip and counteracting the cantilever deflection in response thereto. Also the method may include detecting flooding of the tip and counteracting this condition by adjusting the position of the tip in response thereto. The method for nanoassembly may optionally include the step of thermal curing of the deposited transferable material on the substrate.

In some embodiments, the tip includes a plurality of sub-tips disposed in a predetermined arrangement, and at least a portion of the transferable material is deposited in a predetermined pattern in a single step by the plurality of sub-tips.

In one embodiment, the acquiring step also includes causing the tip to discretely acquire a second transferable material simultaneously with the first transferable material. The depositing step may include operating the tip to deposit at least a portion of the acquired second transferable material simultaneously with at least a portion of the acquired first transferable material. In yet another embodiment, the tip acquires a second transferable material before, during, or after the tip acquires a first transferable material. In yet another embodiment, the tip deposits a second transferable material before, during or after the tip deposits a first transferable material. At least a portion of the second transferable material may be deposited so as to overlap at least a portion of the first deposited transferable material.

In some embodiments, the method for nanoassembly includes the step of causing the tip to vibrate. In one version of this embodiment, the tip vibrates when depositing the acquired transferable material onto the substrate. In another version, the tip vibrates when discretely acquiring the transferable material.

In one embodiment, the method for nanoassembly includes the step of causing momentary contact between the tip and the substrate to deposit a dot of the transferable material. In another embodiment, the method includes translating the tip along the substrate to deposit a line of the transferable material. The line of the transferable material may have a width of less than approximately 100 nm, for example, approximately 17 nm.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention.

DETAILED DESCRIPTION OF THE PREFERRED EMBODIMENTS

The nanoassembly method of the invention provides for the deposition of planar, multi-layer, and three-dimensional nanostructures. In particular, the nanoassembly system can be used for the fabrication of a number of basic canonical structures including lines, dots, and columns. These canonical structures can be combined and adjacently deposited laterally and/or vertically to form complicated and useful structures, devices, and patterns.

Figure 1:
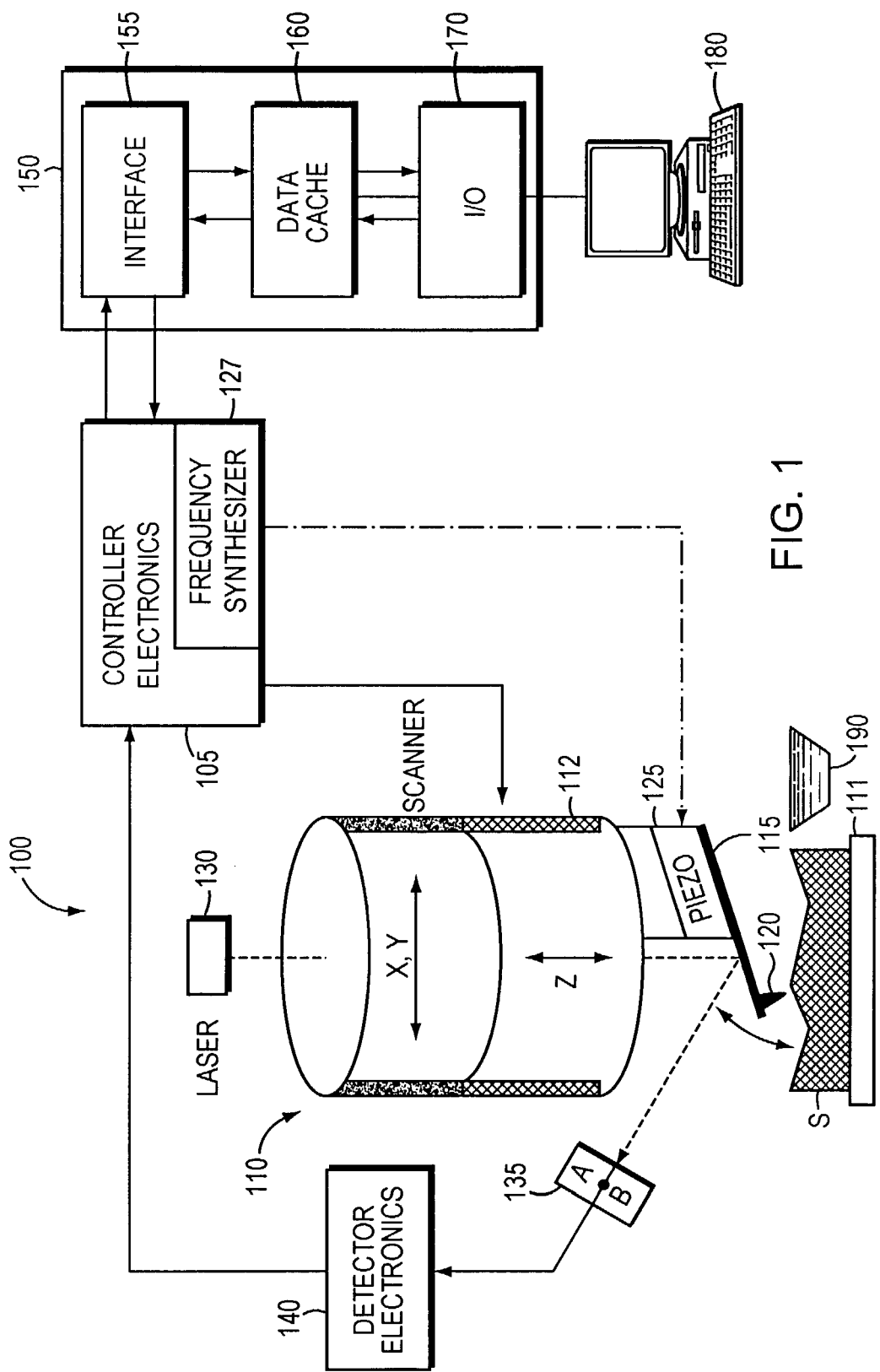
FIG. 1 schematically illustrates the nanoassembly apparatus according to an illustrative embodiment of the invention.

Referring to FIG. 1, in one embodiment, a nanoassembly apparatus 100 in accordance with the invention includes a controller 105 that operates an AFM head 110 in three dimensions over the surface of a substrate S disposed on top of an adjustable substrate positioning stage 111. As illustrated in FIG. 1, the surface of substrate S extends in the (x,y) plane, while movement toward and away from the surface occurs along the z axis. A transport mechanism may execute movement along the three axes using a series of independently operable piezo elements, which are united into a single tube 112. AFM head 110 comprises a bendable cantilever 115, which terminates in a tip 120. In one version of this embodiment, tip 120 is secured directly to the underside of AFM head 110 by way of a magnetic plate angled at a nominal 4.5 degrees relative to substrate S. The end of the tip may be submicron in scale, may be less than 10 µm across, or may be less than 100 µm across. A piezoelectric oscillator 125, itself operated by a frequency-synthesizer module 127 of controller 105, deflects cantilever 115 as indicated by the arrow as tip 120 passes over the substrate S. Alternatively, oscillatory deflection of cantilever 115 may be provided by one or more piezo elements defining or within tube 112. The instantaneous degree of cantilever deflection is monitored by a conventional optical arrangement comprising a laser 130, a split-photodiode detector 135, and a detector circuit 140. The output of detector 140 is fed back to controller 105.

The system 100 also includes a data-handling circuit 150 that orchestrates nanoassembly operations and facilitates communication with standard or non-standard computer architectures. An interface module 155 sends commands to controller 105, causing tip 120 to be brought adjacent a desired point on substrate S. A data cache 160 directs transfer of data about the target structure during nanoassembly, and stores acquired image data in read mode. The data, in turn, is received from or sent to an operator equipped with a computer 180 by means of an input/output module 170. In response to the operator's input, computer 180 through interface 155 causes the controller 127 to direct appropriate movement and operation of AFM head 110. A source of material 190 to be deposited onto substrate S, for example an ink reservoir, is disposed in close proximity to the deposition area of substrate S. The ink reservoir can be located adjacent to, on, or inside tip 120 (or cantilever 115), and the system may include conventional temperature-regulation circuitry to maintain the reservoir at a desired temperature. The nanoassembly process proceeds under computer control to dip tip 120 into reservoir 190 of a soft solid or liquid ink (unless reservoir 190 is located on or inside tip 120), to then translate the tip to the deposition site, and to then quickly lower tip 120 onto substrate S surface to cause deposition of the ink. In one embodiment of the invention, the nanoassembly apparatus 100 is based on an EXPLORER scanning probe microscope available from Thermomicroscopes of Sunnyvale, Calif., with NSC12/W2C model tips coated with a conductive layer of tungsten carbide available from MikroMasch of Moscow, Russia.

Cantilever 115 of the invention can operate in either of two modes, namely, contact mode and tapping mode (sometimes referred to as "non-contact" mode). In a contact mode, cantilever 115 is not actively deflected. Instead, the tip 120 contacts substrate S (or a thin layer of molecules adsorbed thereon) as it is scanned over the surface. Controller 105 moves AFM 110 head along the z axis in response to the detector signal in order to maintain a constant cantilever deflection as tip 120 is scanned over the changing surface topography. By virtue of this feedback loop, the force between tip 120 and the surface remains constant. To obtain an image of the topography of a surface, the changing z-axis position is recorded as the head is scanned over the surface.

In a "tapping" mode, the form of operation preferred herein, cantilever 115 is oscillated at or near its resonance frequency with an amplitude ranging, typically, from 1 nm to 100 nm. For example, cantilever 115 may be 250 µm in length and composed of silicon, with a resonance frequency of 30-300 kHz; such elements are available from Digital Instruments, Santa Barbara, Calif. Tip 120 lightly "taps" on the surface of substrate S during scanning, contacting (or nearly contacting) the surface at the bottom of its oscillation excursion. The feedback loop comprising the detector 135, the detector circuit 140, and the controller electronics 105 maintains a constant oscillation amplitude by raising or lowering AFM head 110 along the z axis to maintain a "setpoint" amplitude and/or frequency.

In some embodiments, the tip that is caused to vibrate with frequencies up to several hundreds of kilohertz is used to both assemble and then immediately image the deposited nanostructures. Due to the vibrating action, the same tip that assembles the nanostructures can go back and scan those nanostructures only moments later, without unintentionally depositing more material onto the substrate. In such embodiments, the operator is able to visualize the nanostructures as they are being constructed in situ.

The vibrating mode also provides the piezo actuators of tube 112 controlling the descent of tip 120 (based, for example, on the vibration amplitude) with advance warning of the approaching surface S. The actuators can then compensate to dramatically reduce the impact forces delivered by tip 120 to the substrate S, which enables the deposition of very high-resolution patterns. Moreover, monitoring the shift in the vibration frequency of tip 120 facilitates accurate real-time measuring of the mass of material gained and lost by tip 120 during each step of the pick-and-place process. Based on such measurements, the process parameters can be adjusted in the middle of a run to achieve the optimum deposition conditions for a range of materials.

Figure 2:
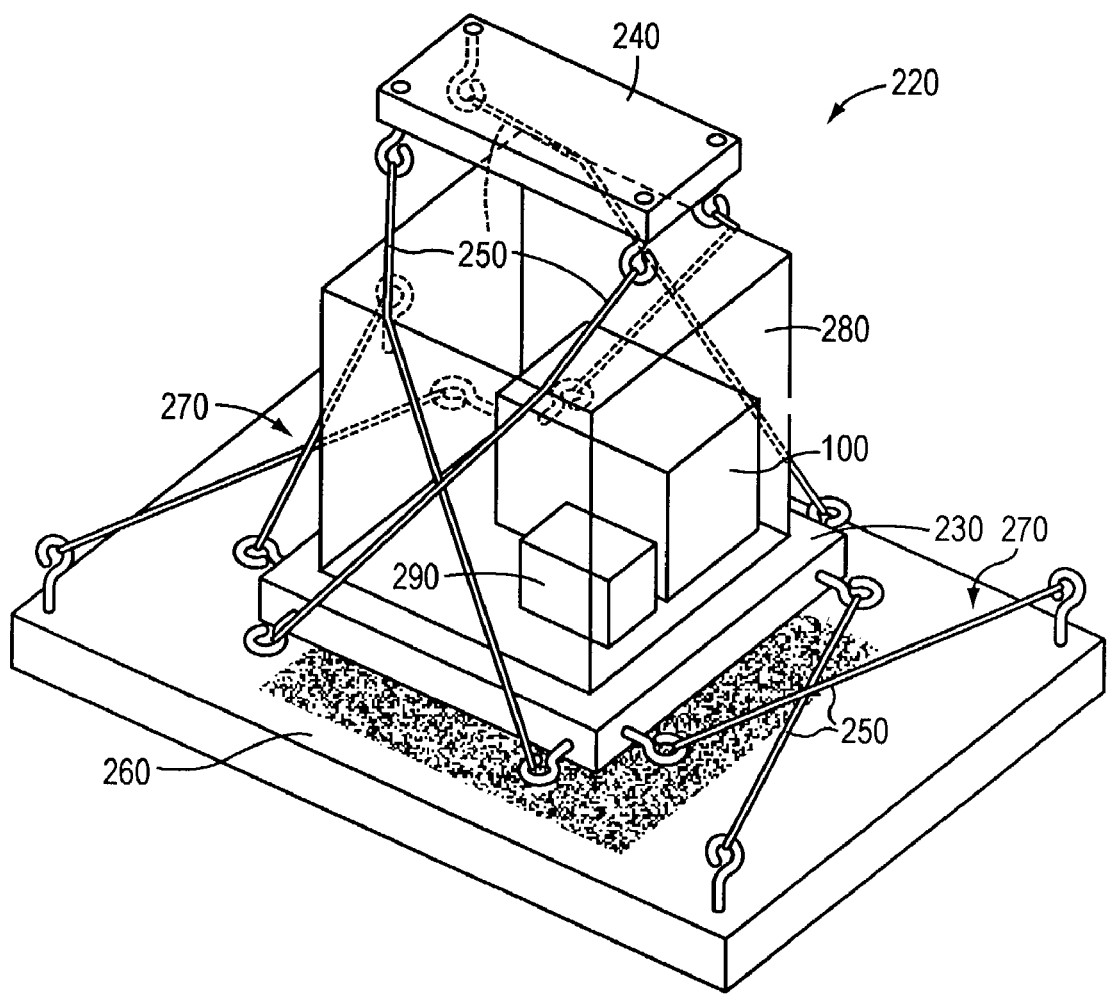
FIG. 2 depicts a vibration isolation system, which may be employed with the nanoassembly apparatus of FIG. 1.

To improve accuracy of the microfabrication and imaging of the deposited nanostructure, it is desirable to provide vibration isolation to nanoassembly apparatus 100. In one embodiment of the invention, the vibration isolation may be provided by a conventional air-levitated isolation table, in which the air is supplied from a pressurized tank or compressor through a regulator. Referring to FIG. 2, in another embodiment of the invention, an elastic (or bungee) cord-supported isolation system 220 provides vibration dampening to the nanoassembly apparatus 100 while maintaining a small physical footprint. The isolation system 220 includes a heavy metal plate 230 hanging from a support 240 by way of two pairs of criss-crossed elastic cords 250. Metal plate 230 serves as the baseplate supporting nanoassembly apparatus 100. To further restrict movement and improve motion damping, the bottom of plate 230 is connected to (but still suspended above) a metal plate 260 by two pairs of criss-crossed elastic cords 270. In one version of this embodiment, plate 260 is heavier than plate 230. Other configurations of vibration isolation system using one or more plates supported by elastic cord arrangements, however, can also be used without deviating from the scope of the invention.

In yet another embodiment of the vibration isolation system, nanoassembly apparatus is placed on top of a multi-layer stack of damping materials, for example, two layers of commonly available plastic bubble-wrap placed on top of a single layer of one-half inch thick carpeting.

Some liquid-phase ink materials used for nanoassembly may quickly evaporate. Because viscosity fluctuations of the ink material may substantially affect the parameters of the deposited structure, it may be desirable to prevent any phase transformations during deposition. Therefore, it is useful to control the temperature and atmospheric conditions under which the nanoassembly apparatus operates. Still referring to FIG. 2, in one embodiment, nanoassembly apparatus 100 is enclosed in an environmental chamber 280, which preferably is transparent to enable visualization, for controlling atmospheric conditions and particle count. In this embodiment of the invention, the nanoassembly process may take place in custom atmospheres, for example, in argon, helium, nitrogen, oxygen, or neon. An in-situ temperature control device 290, for example, one or more single- or double-stack peltiers attached to substrate positioning stage 111 using thermally conducting paste, is used to perform two functions: (1) cool the substrate so that the evaporation rate of the ink in the ink reservoir is reduced, thereby extending the length of time available for nanostructure fabrication using liquid phase inks; and (2) heat the substrate for thermal curing of deposited nanostructures. In one embodiment, when substrate S is being cooled by the peltier or other temperature-controlling device 290, vaporless atmosphere is maintained in the environmental chamber 280 to prevent condensation of moisture onto the substrate. In one version of this embodiment, dehumidification of the area surrounding substrate S is achieved by supplying pressurized argon, nitrogen, or other suitable gas into enclosure 280.

The methods of the invention can be used to assemble materials with a wide range of varying properties including nanoparticles (e.g., conductor or semiconductor nanoparticles) with or without capping groups, microparticles, polymers (e.g., nonconductor, conductor or semiconductor particles), ceramics, ink compositions (e.g., containing nanoparticles and/or nanotubes), gels, oxides, metals, inorganics, solvents, organics, etchants, plating solutions, catalysts, light-curable or light-crosslinkable materials, resists, biological compounds such as genetic and proteomic materials, light-emitting materials such as LEDs, OLEDs and light-emitting polymers, and inorganics (hereafter, collectively, "transferable materials"). Essentially any type and phase of the ink material that can become temporarily adhered to the tip, and can then also become disassociated from the tip thereby allowing the tip to acquire and then deposit the material can be used. In one embodiment, gold and silver nanoparticle inks, diluted to reduce viscosity with alpha-terpineol to metal concentration of about 5-40% by weight, are used. Other inks can also be used, for example, a silicone-based elastomer pre-cursor, such as DOW SYLGARD 184, available from Dow Chemical of Midland, Mich.; a UV-curable clear adhesive, such as NORLAND optical adhesive #72, available from Norland Products, Inc, of Cranbury, N.J.; a photoresist diluted with alpha-terpineol, such as SHIPLEY SPR 3012 or AZ1518, available from Shipley Company LLC of Marlborough, Mass. The tip of a thin metal wire can be used to form ink pools as material reservoirs on a suitable substrate, such as a silicon wafer or a glass slide. To reduce contact angle and reduce undesirable "flooding" of a cantilever tip upon contact with the ink, in one embodiment, the ink-laden wire is dragged across to the substrate to form an elongated oval-shaped pool.

Nanoassembly deposition can be conducted on a variety of substrates, including glass, quartz, plastics, polyimide, kapton, silicon, and metal foil. In one embodiment, the nanostructure is deposited onto a silicon wafer.

Operation of the nanoassembly system of the invention involves a large number of control parameters and variables. In one embodiment, the invention utilizes an expert software system that requests desired fabrication parameters from the user (such as line width, dot size, viscosity of the ink materials, elapsed drying time of the ink in the ink reservoir, etc.) and automatically generates script templates for the computer commands that control many aspects of the nanoassembly process including tip position and velocity, tip dwell time, and impact forces used to pick up and deposit ink materials. Such software simplifies the process of writing new control code to accommodate some change in nanoassembly fabrication parameters or constraints. The functions implemented by such structure are described below.

Figure 3A:
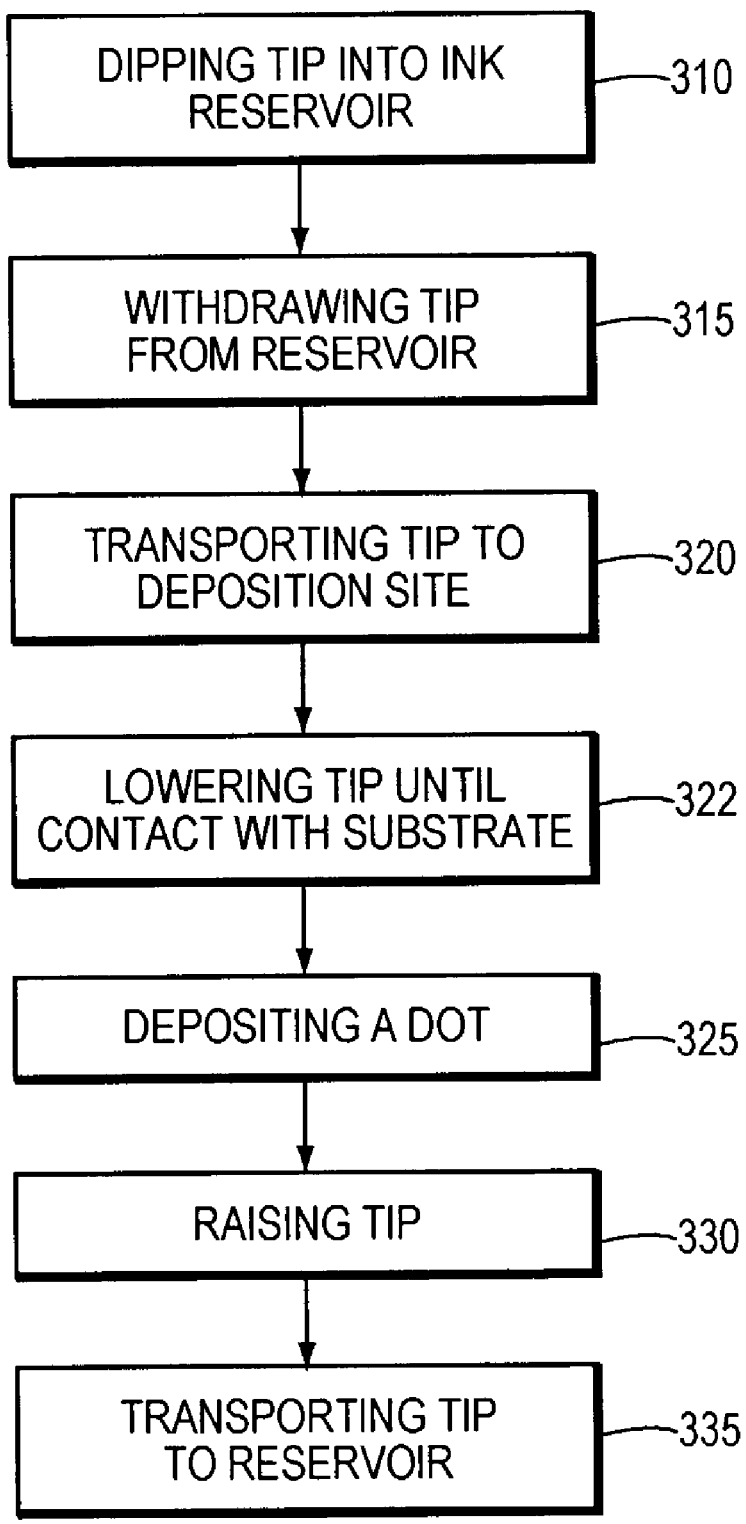
FIG. 3A depicts the steps of a method for nanoassembly of dotted patterns according to an illustrative embodiment of the invention.

Referring to FIG. 3A, in one embodiment, a method for nanoassembly of dotted patterns using liquid or soft-solid phase inks begins with dipping the tip into a reservoir of ink with the cantilever operating in either contact mode or tapping mode (STEP 310). The method further includes withdrawing the tip from the reservoir with a small quantity of ink material adhering to the tip (STEP 315). Then, the tip is transported, preferably at a high rate of speed, for example 1 mm/s to 1 m/s at a height of several μm above the surface of the substrate to the deposition site (STEP 320). Following arrival at the deposition site, the tip is lowered and comes into contact with the substrate (STEP 322), thereby depositing the adhered ink material in the form of a dot of ink (STEP 325). Generally, no externally supplied bridging medium, such as a humidity-initiated water meniscus, is required between the tip and the substrate to facilitate deposition of the adhered ink material. After the dot is deposited, the tip is immediately raised from the surface (STEP 330). The method concludes with high-speed levitated transportation of the tip back to the ink reservoir (STEP 335). The cycle is repeated at a high frequency once for every dot that is deposited. In one version of this embodiment, the method is performed at a frequency of at least one cycle per second.

Figure 3B:
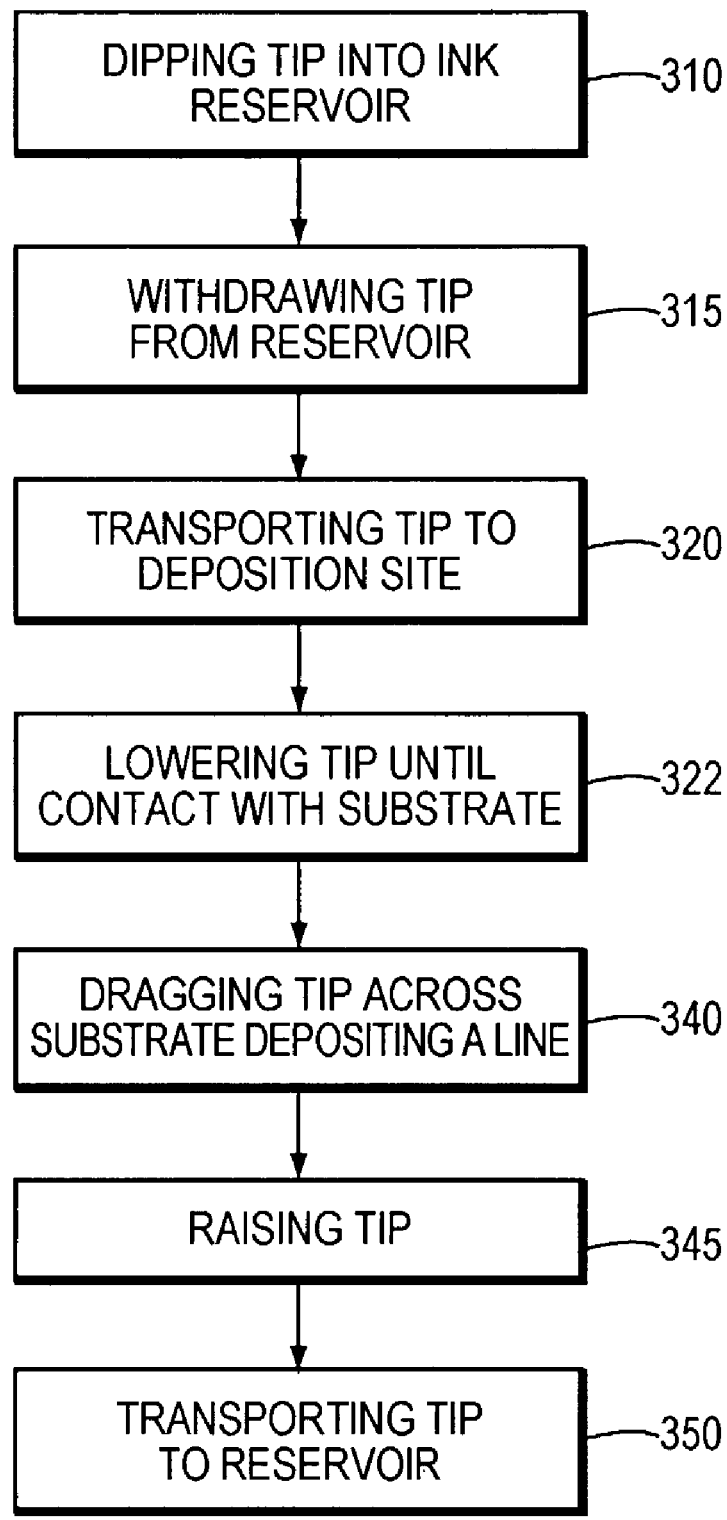
FIG. 3B depicts the steps of a method for nanoassembly of line patterns according to an illustrative embodiment of the invention.

Referring to FIG. 3B, in another embodiment, a method for nanoassembly of line patterns using liquid or soft-solid phase inks includes steps 310-322 described above. Following the arrival at the deposition site, the tip is lowered until it comes into contact with the substrate, and is subsequently dragged along the substrate causing the tip to leave behind a trail of ink. When using liquid-phase inks, the possibility of deposition of a large undesirable "bulbous" structure at the beginning of the line is typically minimized by using a tip operating under tapping mode instead of contact mode, because the vibration of the tip in tapping mode prevents the ink on the tip from "flooding" the substrate (STEP 340). After the line is deposited, the tip is immediately raised from the surface (STEP 345). The method concludes with high-speed levitated transportation of the tip back to the ink reservoir (STEP 350).

The nanoassembly system can achieve high-resolution structures by controlling a number of variables and parameters. For example, typically, the size of deposited dots and lines is directly proportional to the sharpness of the tip of the cantilever and the force applied by the tip to the substrate at the point when the dot is deposited, and inversely proportional to the viscosity of the ink. Also, when the tip is dipped into the ink reservoir and controlled so that the tip engages the ink in the reservoir at or near the damped resonance frequency of the cantilever-reservoir system, a cantilever operating in a tapping mode typically extracts a smaller volume of ink from the reservoir compared to a cantilever operating in a contact mode, thereby enabling subsequent deposition of smaller dots onto the substrate. Furthermore, a cantilever operating in a tapping mode when depositing the dot upon the substrate is capable of providing an advance warning of the approaching surface as the tip descends to deposit a dot, thereby reducing the tip-to-surface impact force and enabling the deposition of smaller dots as compared to the cantilever operating in a contact mode.

In some embodiments, when using liquid-phase materials that are composed of solid phases (such as organically capped nanoparticles) within a liquid solvent or carrier, it is desirable to control the viscosity of the ink. Specifically, the viscosity of the ink can be reduced by adding more solvent to the reservoir; maintained by cooling the material reservoir to hinder solvent evaporation; or increased by heating the material reservoir to enhance solvent evaporation and partial thermal curing. Due to evaporation effects, the viscosity of the material attached to the tip may change while the tip is transported from the reservoir to the deposition site.

Figure 3C:
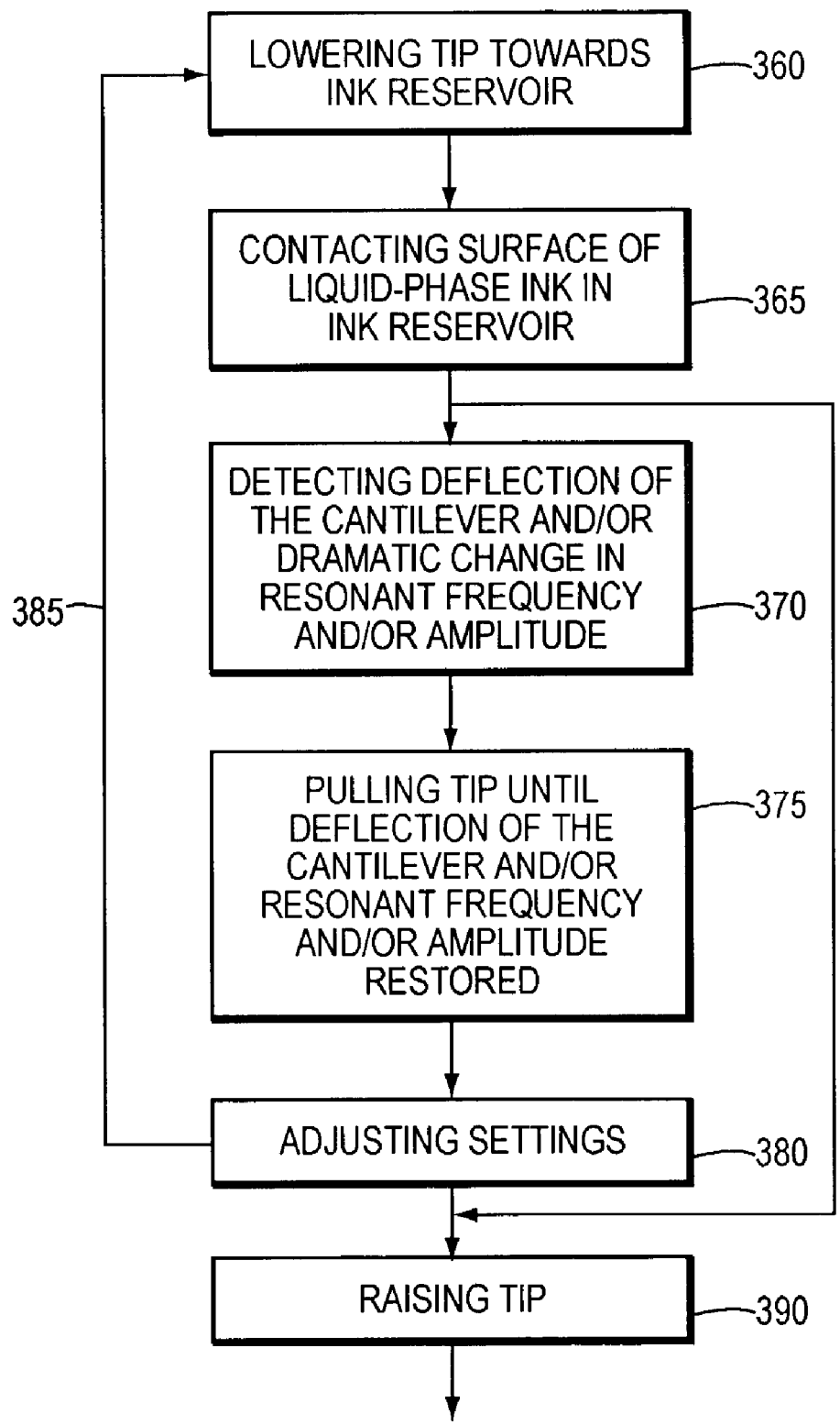
FIG. 3C depicts a "flooding compensation" technique, which may be employed with the methods for nanoassembly of FIGS. 3A-3B according to another illustrative embodiment of the invention.

Referring to FIG. 3C, in one embodiment of a method for nanoassembly using liquid-phase inks, a "flooding compensation" technique can be employed to prevent undesirable overloading of the tip with ink that occurs when the tip is lowered into the ink reservoir and the ink rapidly traverses the entire length of the cantilever, thereby oversupplying the deposition zone on the substrate under or adjacent the cantilever with a layer of ink. This technique includes the following steps:

(1) the tip is lowered into the ink reservoir (STEP 360) until it contacts the surface of the liquid-phase ink in the ink reservoir (STEP 365);

(2) as liquid ink begins to "flood" or rush onto the tip from the ink reservoir, the feedback circuit of the piezo actuator of the z axis ("vertical motion actuator") detects the deflection of the cantilever (when using contact mode) and/or the dramatic change in resonant frequency and/or amplitude (when using tapping mode)(STEP 370);

(3) to compensate for this deflection and/or change in resonant frequency and/or amplitude, the vertical motion actuator is immediately activated to pull the tip farther up out of the reservoir, thereby preventing the ink from rushing upon the tip and down the length of the supporting cantilever (STEP 375);

(4) by adjusting the integral setting of the feedback loop to accommodate a number of factors including the viscosity of the ink and the force setpoint, the tip can resonantly engage the ink reservoir without flooding to create a standing ripple wave within the ink reservoir (STEP 380);

(5) when the cantilever deflection and/or resonant frequency and/or amplitude is restored as the tip is withdrawn from the reservoir, the vertical motion actuator again drives the tip back down into the reservoir (STEP 385); and (6) a discrete amount of ink is made to adhere to the tip when the tip is eventually withdrawn from the ink reservoir (STEP 390).

In another embodiment of the invention, a "flooding compensation" technique can be employed to prevent undesirable deposition flooding, which occurs when the tip attempts to deposit its load of liquid-phase ink onto a substrate which results in the deposition of a very large dot or the deposition of a line with a large bulbous structure at one end. Flooding compensation techniques can be employed for both contact and tapping modes, but tapping mode usually provides significantly faster response times and more accurately deposited structures.

As mentioned above, in a particular embodiment of the invention, the cantilever operates in a tapping mode (i.e. having a vibrating tip). This mode is characterized by enhanced feedback sensitivity, which enables the tip to engage the ink reservoir and substrate with reduced forces when extracting ink from the reservoir and depositing the ink onto the substrate, respectively. Reduced forces preserve the sharpness of the tip and enable the formation of smaller nanostructures. Also, in the tapping mode, the operator is able to monitor the mass of ink transferred by the tip to and from the ink reservoir and the substrate in real time. In particular, the mass of material acquired by the tip during the reservoir dipping step, and the mass of material deposited by the tip onto the substrate can be monitored and calculated in real time by observing the shifts in the tapping mode resonant frequency and/or amplitude of the cantilever to which the tip is mounted.

In one version of this embodiment of the invention, the nanoassembly system employs an algorithm for re-adjusting the drive frequency of the vertical motion actuator using the cantilever feedback loop to more closely match the resonant frequency of the cantilever (or other vibration element to which the tip is attached), thereby adjusting for the changes in the cantilever frequency that results from the tip acquiring and losing mass during the dipping, transporting, and depositing steps. This algorithm includes adjusting frequency sweeps to find the newly acquired resonant frequency of the cantilever; re-calibrating the scale used to define the desired vibration amplitude of the cantilever so that the maximum signal derived from the resonant peak is set to be at full scale; and setting the vertical motion actuator drive frequency to coincide with the cantilever frequency to obtain the maximum resonant response or to obtain a particular desired non-maximum response.

Various techniques can be employed to enable the tip to acquire the ink in addition to the method recited in step 310 above. In some embodiments, the tip is exposed to a spray, vapor, nebulization, plasma, condensing gas, or powder deposition, of the ink material. Also, another tip or brush-like or sponge-like instrument may be used to apply or deposit the ink onto the tip. Furthermore, in yet another embodiment, an ink reservoir is located adjacent to or inside or on the tip and/or cantilever so as to enable the ink to move along the outside or through the inside of the tip and/or cantilever to reach the extremity thereof.

In still another embodiment, a solvent-laden tip is dipped into the solid-phase ink in a reservoir via the "solvent assisted" nanoassembly method. In this embodiment, solid ink in a reservoir is locally softened or partially dissolved by a small quantity of solvent transferred by the tip itself to the ink reservoir from a solvent reservoir disposed proximally thereto. Thusly softened or dissolved solid ink is then extracted from the ink reservoir by the tip, as described above.

In one version of this embodiment, use of a solvent facilitates extraction of solid-phase ink from a reservoir by the tip in a tapping mode despite the limited forces that can be applied by the tapping mode tip to the surface of the reservoir. During the nanoassembly process, the tip is dipped into a first reservoir of solvent and then into a second reservoir of solid ink before the fabrication of each dot or line. Solvent-assisted techniques according to this embodiment of the invention facilitate relatively prolonged construction of complex planar designs, because the duration of fabrication is limited only by the overall evaporation time of the solvent and not by the evaporation time of the ink in the ink reservoir. Also, because typical solvents do not change viscosity during evaporation, many viscosity-related compensation methods (such as dynamic tuning algorithms) need not be employed during fabrication. This solvent-assisted technique, which is applicable both to contact mode and to tapping mode, enables fabrication of relatively long, substantially uniform lines that can be drawn continuously until the solvent runs out or dries out. Alternatively, the solvent can be any liquid-phase material (such as an etchant) that causes the solid ink in the reservoir to soften or dissociate or dissolve, so as to become adhered to the tip.

Figure 4:
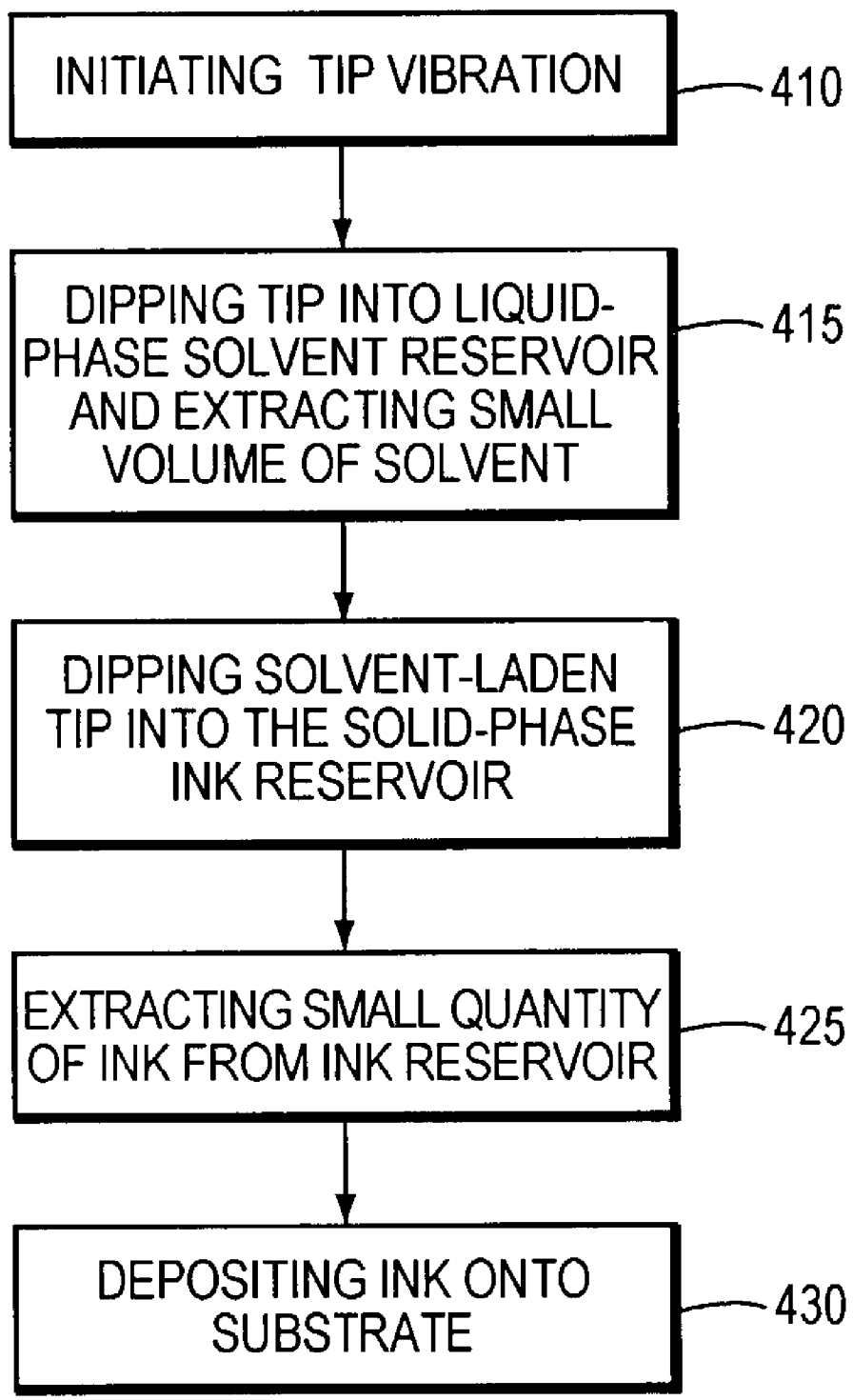
FIG. 4 depicts the steps of a solvent-assisted method for nanoassembly according to an illustrative embodiment of the invention.

Referring to FIG. 4, in a particular embodiment, the solvent-assisted nanoassembly method includes the following steps:

(1) initiating vibration of the tip (STEP 410);
(2) dipping the tip into the liquid-phase solvent reservoir and extracting a small volume of solvent (STEP 415);
(3) dipping the solvent-laden tip into the solid-phase ink reservoir, wherein the solvent immediately begins to soften and/or dissolve the solid ink in a region near the tip (STEP 420);
(4) extracting a small quantity of ink from the ink reservoir with the tip (STEP 425); and
(5) depositing the ink onto the substrate with the tip to form a dot, line, column, or other desirable nanostructure (STEP 430).

In one version of this embodiment, one or both of the solvent reservoir and the ink reservoir are located adjacent or inside or on the tip and/or cantilever. Also, various techniques can be employed to enable the tip to deposit the ink in addition to the method recited in steps 325 and 340 above. For example, in one embodiment, the extremity of the tip is exposed to an "ink disassociation enhancing" means that assists in removing the ink from the tip, thereby causing the ink to preferentially adhere to the substrate or other pre-existing structure or pattern on the surface of the substrate. Examples of such means include thermal sources, such as radiation sources, peltiers, hot plates, resistively heated zones, and lasers; light sources for fixing light-curable materials; cooling sources including refrigeration units and peltiers for fixing "freeze-able" ink materials; sources of a second material that help to remove a first ink material from the tip and assist in getting that first ink material to preferentially adhere to the substrate; and high energy sources located on or in the tip including an electron beam emitter or laser.

In one embodiment of the invention, a tip capped with multiple "sub-tips," located at the extremity of the tip in a specified arrangement, is used to simultaneously deposit a complicated pattern in a single deposition step. For example, all of the required components of a single electron transistor (the gate, source, drain, and Coulomb blockade island) can be deposited in one deposition step. In one version of this embodiment, these multiple "sub-tips" can be located so closely adjacent to one another as to approximate the topographical features of a nanostamp. Thus, the tip can be used like a nanostamp, wherein the relief pattern on the end of the tip can be transferred to the substrate via an ink pattern. In another version of this embodiment, multiple sub-tips are used to simultaneously retrieve and deposit different kinds of ink materials.

Figure 5:
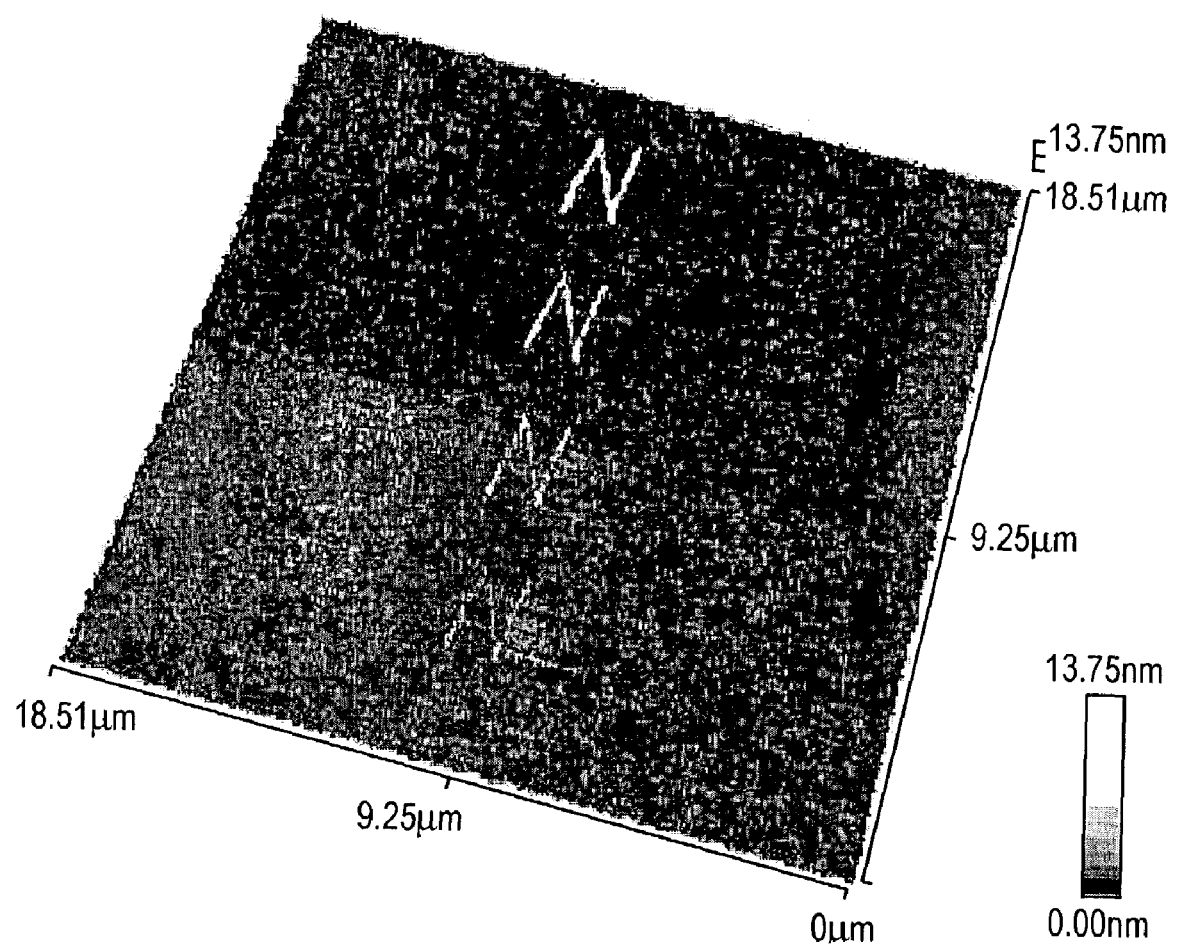
FIG. 5 depicts images of sample nanostructures deposited using the "grayscale" method according to an illustrative embodiment of the invention.

In one embodiment of the invention, grayscale patterns with varying linewidths and dot sizes can be generated by using a single dipping operation in the ink reservoir followed by two or more consecutive deposition steps so that the linewidth and dot size decrease with greater numbers of deposition steps. Referring to FIG. 5, four "grayscale" copies of the letter "N" have been assembled in parallel. Four different line thicknesses were achieved by using a single ink pool dipping operation followed by four consecutive deposition steps, one for each "N" being constructed. As shown in FIG. 5, dot size is uniform and repeatable, as demonstrated by a series of grayscale lines that were formed simultaneously, built up from many dots using grayscale methods. The grayscale method of this embodiment can be employed with both liquid-phase and solid-phase ink materials.

As mentioned above, in general, dot size can be reduced by altering a number of parameters including tip force, tapping or contact mode, and viscosity or hardness of the ink material. Dot size can also be substantially reduced by using a "scratch pad" method wherein the tip is dipped only once into the ink reservoir and is then used to deposit more than one dot onto the substrate. Excess ink is removed from the tip via the first several deposited dots (in a separate "scratch pad" location on or off the substrate). The final dot to be deposited is much smaller than could normally be obtained (even when using a very sharp tip). Thus, a "scratch pad" zone can be used to "pre-deposit" larger nanostructures, followed by precision deposition of much smaller nanostructures within the intended fabrication area. This method is similar to the "grayscale" method described above and shown in FIG. 5, except that the dots deposited in the "scratch pad" zone are discarded.

The scratch pad method can be employed with both liquid-phase and solid-phase ink materials. With a sufficient number of pre-deposition steps conducted within the scratch pad zone, a single molecule, a single atom, or a single nanoparticle may remain at the extremity of the nanotip for subsequent deposition within the intended fabrication area. The scratch pad method allows a tip with a relatively large tip radius (several tens of nanometers in most cases) to deposit a diminishing small dot (approximately 2 nm or smaller) of material onto the substrate. Such a small dot of a metal or other conductive or semiconductive material is particularly useful as the Coulomb blockade island in a single electron transistor.

In one embodiment of the invention, the nanoassembly system uses the same tip for (1) direct deposition of nanostructures; (2) imaging of those nanostructures during and after their deposition (i.e. using the scanning probe microscope in its conventional role of generating an image of small-scale topography); and (3) imaging of alignment marks and/or pre-existing structures. The ink material that becomes adhered to the tip during dipping of the tip into a reservoir of material only minimally deteriorates the tip's capability for subsequent high-resolution imaging. In one version of this embodiment, imaging resolution is improved by dipping the tip into a reservoir of solvent or light etchant just prior to the imaging step, thereby removing some or all of the adhered ink material. In an alternative embodiment, a dedicated tip is used for imaging during and after the deposition.

According to embodiments of the invention, in-situ imaging of the substrate, alignment marks, and pre-existing structures is conducted periodically during the deposition process to visualize the deposited structure and adjust the system settings if necessary to compensate, for example, for relative thermal drift between the substrate and the tip and accumulation of feedback loop control errors.

Many ink materials require curing during or after deposition to obtain a stable nanostructure. In a preferred embodiment of the invention, the deposited structures are cured in-situ without removal of the substrate from the positioning stage using different curing devices, for example heating devices, such as peltiers that are also used for cooling of the substrate, as described above, laser sources, ultra-violet or infrared light sources, electric current sources, electric voltage sources, or electron-beam sources.

To prevent force-related flattening of the deposited structure after deposition and to facilitate construction of three-dimensional nanostructures, in one embodiment, the invention provides for curing or fusing of newly deposited material (while simultaneously vertically supporting it with the tip) using an electron beam emitted from the tip of the nanoassembly apparatus. In this embodiment, a curing process causes a phase transformation at the very instant that the tip comes into contact with the top surface of the multi-layer structure. The tip remains in contact with the deposited material until the end of the phase transformation, thereby serving as a support for the newly deposited material to counteract intermolecular and surface forces. A local emitted electron beam can be used to cure (i.e., crosslink, fuse or melt) and instantly weld any material that is generally curable, solidifiable, fusible or meltable using electron beam radiation. Examples of such inks include nanoparticle inks, UV-curable polymers, and E-beam-curable polymers. Thus, in this embodiment of the invention, an electron beam emitted from a conductive tip instantly welds new materials into place on top of the substrate and/or on top of pre-existing nanostructures, thereby facilitating construction of three-dimensional nanostructures. In this embodiment, high melting point coating materials, such as silicon carbide, may be used to provide a robust conductive surface for electron emission from the tip. A suitable range of a tip-to-substrate current during the electronbeam-assisted nanoassembly is between approximately 2 to 20 micro-amps. In one version of this embodiment, in order to maintain a constant flow of electrons despite substantial fluctuations in the circuit resistance as the tip makes and breaks contact with the substrate, a fast-acting current source is used as a source of electrons to be supplied to the tip. In another version, a voltage source is used. Preferably, the electron source is triggered on and off by a threshold applied to the force signal generated by the deflection of the tip (for contact mode) or the shift in cantilever resonant amplitude/frequency (for tapping mode) as the tip makes and breaks contact with the substrate. In another embodiment, an electron emission source with a relative large (>multimicron) spot size, located on, inside, adjacent, or some distance away from the tip, is used to cure the material deposited by the tip.

In another embodiment, a light source, for example a laser or non-coherent source, such as a medium-pressure mercury lamp, is used to cure light-sensitive materials such as UV-curable optical adhesives deposited by the nanoassembly system. Because some light-sensitive inks, such as UV-curable optical adhesives, exhibit exceedingly low vapor pressures and do not readily evaporate or harden at room temperatures, the viscosity or softness of the inks can be kept constant for very long periods of time without the requirement for the reduced fabrication temperatures, thereby enabling fabrication of complex patterns over long periods of time in ambient (humid) environments. UV-curable materials generally include a photoinitiator, i.e. an ingredient that generates free radicals, which initiates cross-linking between the unsaturation sites of monomers, oligomers, and polymers. In one version of this embodiment, a light source located on or near the tip of the cantilever can be used to intermittently optically cure the deposited materials in the deposition site each time that the tip moves away from the deposition site. In another version of this embodiment, a precisely focused light source, preferably a laser with small spot size, can be used to cure the light sensitive ink onto the substrate while the tip is still attached to and temporarily physically supporting the deposited ink within the construction zone, thereby enabling the construction of three-dimensional nanostructures.

In yet another embodiment, thermally activated tips, for example resistively heated zones on the cantilever adjacent to the tip or on apex of the tip, and/or thermally activated substrates, for example peltier heated/cooled substrates or regions on the substrate or resistively heated zones on or in the substrate, provide for in situ intermittent localized thermal curing of nanostructures at the very instant when the nanostructures are deposited by the tip onto the substrate or onto other pre-existing nanostructures, thereby enabling the construction of three-dimensional nanostructures.

In yet another embodiment, an integrated laser device, located on or near or some distance away from the tip, enables in situ intermittent and/or continuous thermal curing, fusing, melting or solidification of nanostructures while the nanoassembly proceeds. In one version, an infrared laser-curing device enables in-situ thermal exposure of the deposited structure at substantial temperatures without removal of the substrate from the positioning stage and subsequent re-positioning and alignment during the nanoassembly process (as would normally be required for curing using a large hot-plate or oven). In a second version, a laser device heats the tip (and/or cantilever), which tip then conducts the heat to the deposited structure. In other words, heating may occur before, during or after deposition.

In another version of this embodiment, the laser-curing device is employed for intermittent thermal curing after deposition of each layer of the structure to obtain a multi-layer structure. For example, a laser with a relatively large (multi-micron) spot size can be used to intermittently thermally cure the deposited materials in the deposition site each time that the tip moves away from the deposition site.

In yet another version, a precisely focused and aimed laser with a small spot size (sub-micron) can be used to weld and/or thermally cure the deposited ink materials onto the substrate while the tip is still attached to and temporarily physically supporting the deposited ink material within the deposition site, thereby enabling the construction of three-dimensional nanostructures.

Figure 6:
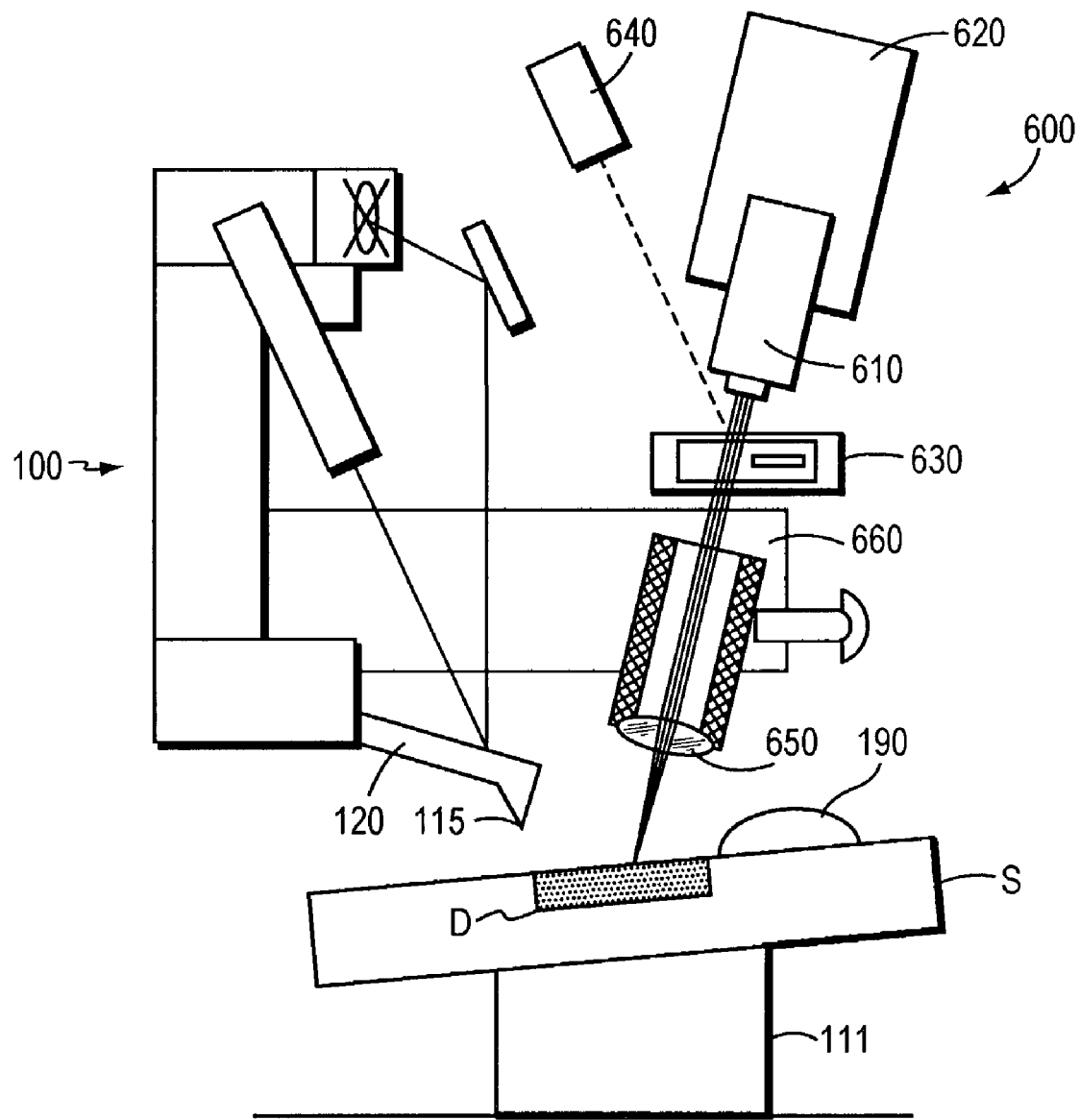
" "FIG. 6 schematically illustrates a nanoassembly apparatus including a laser curing device according to another illustrative embodiment of the invention.

Referring to FIG. 6, in an illustrative embodiment, a laser curing system 600 that is employed with the nanoassembly apparatus 100 includes a laser source 610, a laser source rotating mount 620, a laser beam shutter 630, beam dump 640, focusing lens 650, and a positioning platform 660. In one embodiment of the invention, a ytterbium fiber infrared laser, such as the YLD-5000 laser available from IRE-Poulus Group, emitting at 1060 nm, is used to supply optical power to a deposition site D on substrate S. In one version, the maximum optical power supplied is about 5 watts. The near-collimated laser beam is focused down to illuminate a small fraction of the deposition site D on substrate S near tip 115 of cantilever 120 using the focal lens 650 positioned proximately to substrate S. In one version of the embodiment, the laser curing system 600 focuses to about a 20×10 µm$^2$ spot within deposition site D. Timed laser beam exposure is provided by the laser beam shutter 630, for example, a solenoid-driven shutter, placed between the laser source 610 and the focusing lens 650. In one version of this embodiment, 50 ms long laser bursts were triggered by timing signal output during the deposition sequence. In another version of this embodiment, timed or pulsed laser beam exposure is provided by the laser itself (without assistance from a shutter) to obtain exposure times as short as femtoseconds. In order to precisely direct the laser beam to deposition site D without thermally affecting the ink reservoir 190 disposed nearby, a positioning platform 660 controls the horizontal location, lateral location, rotation, pitch, and yaw of nanoassembly apparatus 100 relative to the incoming laser beam. The laser beam source is mounted on the rotating mount 620 that provides additional aiming control flexibility. In addition, substrate S is disposed on top of adjustable positioning stage 111.

Figure 7:
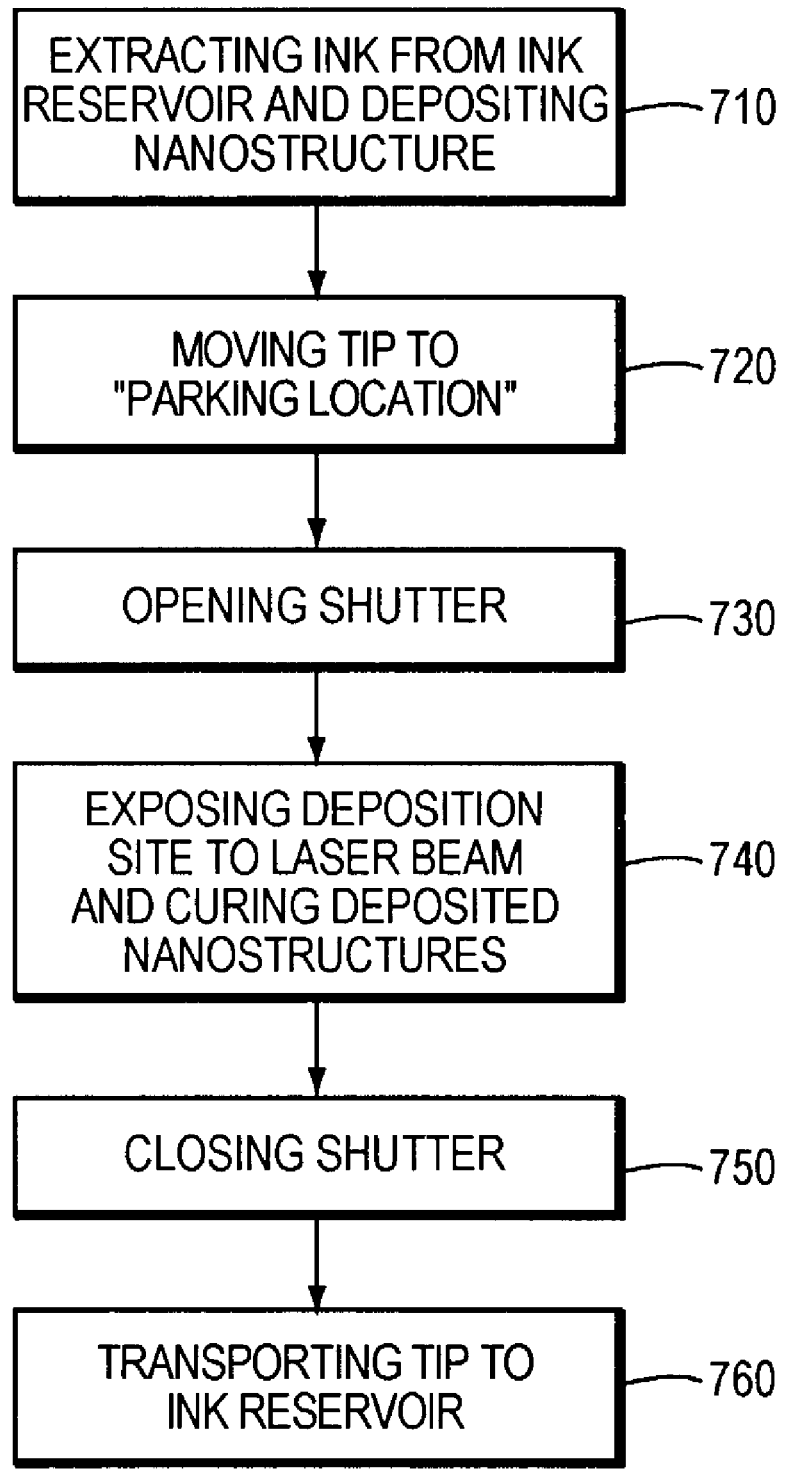
FIG. 7 depicts the steps of a method for nanoassembly using the nanoassembly apparatus shown in FIG. 6.

Referring to FIG. 7, for laser-assisted nanoassembly, the methods of the invention described above include a few extra steps at the end of each deposition cycle. After the tip extracts inks from the reservoir and deposits the ink in the deposition site (STEP 710), instead of returning immediately to the ink reservoir after deposition of the ink, the tip is directed to move to a "parking location" where it can not be damaged by the laser beam (STEP 720). Then, the computer controlled shutter opens (STEP 730) and the deposition site is exposed to the laser beam, which cures the most recently deposited nanostructures in the deposition site (STEP 740). After curing, the shutter is closed (STEP 750); and the tip returns to the ink reservoir to begin the cycle again (STEP 760).

It will be apparent to those skilled in the art that various modifications and variations can be made to the above-described structure and methodology without departing from the scope or spirit of the invention.

The invention claimed is:

1. A method of assembling a structure, the method comprising the steps of:
   (a) providing a submillimeter-scale tip; and
   (b) pick-and-place depositing a first transferable material, comprising:
      (b)(i) causing the tip to acquire the first transferable material from a reservoir;
      (b)(ii) operating the tip to deposit at least a portion of the acquired first transferable material at a predetermined location onto a substrate without a bridging medium; and
      (b)(iii) repeating steps (b)(i) and b(ii) to create a structure using the first transferable material.

2. The method of claim 1, wherein the structure is two-dimensional having nanometer-scale features defined by the tip.

3. The method of claim 1, wherein the structure is three-dimensional with nanometer-scale features defined by the tip, at least some of the transferable material being deposited onto previously deposited transferable material.

4. The method of claim 1, wherein step (b)(i) further comprises facilitating a continuous flow of the transferable material to the tip from the reservoir.

5. The method of claim 1, wherein the transferable material is at least one material selected from a group consisting of: viscous liquids, non-viscous liquids, soft solids, nanoparticles, and polymers.

6. The method of claim 1, wherein the transferable material comprises metal particles.

7. The method of claim 1, wherein the transferable material does not chemically bond to the substrate upon deposition thereon.

8. The method of claim 1, wherein the tip comprises a nanotube.

9. The method of claim 8, wherein the nanotube comprises carbon.

10. The method of claim 1, wherein the tip comprises silicon.

11. The method of claim 1, wherein the tip is located on a bendable cantilever and further comprising monitoring and controlling the forces exerted on the tip.

12. The method of claim 11, further comprising causing the tip to apply a predetermined amount of force to the substrate.

13. The method of claim 11, further comprising monitoring a force with which the tip deposits the transferable material onto the substrate in order to determine an amount of the transferable material deposited.

14. The method of claim 11, further comprising monitoring a force with which the tip acquires the transferable material in order to determine an amount of the transferable material acquired.

15. The method of claim 11, further comprising monitoring a deflection of the cantilever indicative of flooding of the tip and counteracting the cantilever deflection in response thereto.

16. The method of claim 1, further comprising curing the deposited transferable material on the substrate.

17. The method of claim 16, wherein the curing step occurs before deposition.

18. The method of claim 16, wherein the curing step occurs during deposition.

19. The method of claim 16, wherein the curing step occurs after deposition.

20. The method of claim 1, further comprising using a scanning probe microscope to image the structure following deposition thereof.

21. The method of claim 1, further comprising causing the tip to mechanically vibrate and monitoring a shift in a vibration frequency of the tip.

22. The method of claim 1, wherein step (b)(iii) further comprises causing momentary contact between the tip and the substrate to deposit a first dot of the transferable material.

23. The method of claim 1, further comprising, before step (b)(iii), repeating steps (b)(i) and (b)(ii) at least once, thereby depositing a second dot of the transferable material.

24. The method of claim 23, wherein a grayscale pattern is formed.

25. The method of claim 1, wherein step (b)(iii) further comprises dragging the tip along the substrate to deposit a line of the transferable material.

26. The method of claim 25, wherein the line of the transferable material has a width of less than approximately 100 nm.

27. The method of claim 26, wherein the line of the transferable material has a width of less than approximately 17 nm.

28. The method of claim 25, wherein the linewidth is decreased and a grayscale pattern is formed.

29. The method of claim 1, further comprising the step of causing the tip to acquire a solvent before or after acquisition of the first transferable material.

30. A method of assembling a nanostructure, the method comprising the steps of:
  (a) providing a submillimeter-scale tip comprising a plurality of sub-tips disposed in a predetermined arrangement; and
  (b) pick-and-place depositing a first transferable material, comprising:
    (b)(i) causing the tip to acquire the first transferable material;
    (b)(ii) operating the tip to deposit at least a portion of the acquired first transferable material at a predetermined location onto a substrate without a bridging medium; and
    (b)(iii) repeating steps (b)(i) and (b)(ii) to create a structure using the first transferable material.

31. The method of claim 30, wherein the tip acquires the transferable material from a reservoir.

32. The method of claim 30, wherein, in step (b)(ii), the at least a portion of the transferable material is deposited in a predetermined pattern in a single step by the plurality of sub-tips.

33. The method of claim 32, wherein the plurality of sub-tips comprises a stamp having a predetermined pattern of topographical features.

34. The method of claim 30, wherein step (b)(i) further comprises causing the tip to discretely acquire a second transferable material simultaneously with the first transferable material.

35. The method of claim 34, wherein step (b)(ii) further comprises operating the tip to deposit at least a portion of the acquired second transferable material simultaneously with at least a portion of the acquired first transferable material.

36. A method of assembling a structure, the method comprising the steps of:
  (a) providing a submillimeter-scale tip;
  (b) causing the tip to mechanically vibrate;
  (c) monitoring a shift in a vibration frequency of the tip;
  (d) causing the tip to acquire a first transferable material;
  (e) operating the tip to deposit at least a portion of the acquired first transferable material at a predetermined location onto a substrate without a bridging medium; and
  (f) repeating steps (b) to (e) to create a structure using the first transferable material.

37. The method of claim 36, wherein the tip vibrates when depositing the acquired transferable material onto the substrate.

38. The method of claim 36, wherein the tip vibrates when discretely acquiring the transferable material.

39. The method of claim 36, further comprising controlling the descent of the tip towards the substrate by monitoring the shift in a vibration frequency of the tip.

40. The method of claim 36, further comprising controlling the amount of the transferable material acquired by the tip by monitoring the shift in a vibration frequency of the tip.

41. The method of claim 36, further comprising controlling the amount of the transferable material deposited onto the substrate by the tip by monitoring the shift in a vibration frequency of the tip.

* * * * *